United States Patent
Chun (10) Patent No.: US 7,238,584 B2
(45) Date of Patent: Jul. 3, 2007

(54) METHODS OF FABRICATING INTEGRATED CIRCUIT DEVICES HAVING RESISTORS WITH DIFFERENT RESISTIVITIES THEREIN

(75) Inventor: Kwang-youl Chun, Round Rock, TX (US)

(73) Assignee: Samsung Electronics Co., Ltd. (KR)

( * ) Notice: Subject to any disclaimer, the term of this patent is extended or adjusted under 35 U.S.C. 154(b) by 70 days.

(21) Appl. No.: 11/184,413

(22) Filed: Jul. 19, 2005

(65) Prior Publication Data

US 2006/0088973 A1  Apr. 27, 2006

(30) Foreign Application Priority Data

Oct. 21, 2004  (KR)  ............ 10-2004-0084395

(51) Int. Cl.
*H01L 21/20* (2006.01)
(52) U.S. Cl. .................. 438/381; 257/E21.004
(58) Field of Classification Search .......... 438/381; 257/E21.004
See application file for complete search history.

(56) References Cited

U.S. PATENT DOCUMENTS

| | | | |
|---|---|---|---|
| 4,643,777 A | | 2/1987 | Maeda |
| 5,489,547 A | * | 2/1996 | Erdeljac et al. ............ 438/238 |
| 5,618,749 A | * | 4/1997 | Takahashi et al. .......... 438/384 |
| 6,040,596 A | | 3/2000 | Choi et al. |
| 6,204,105 B1 | * | 3/2001 | Jung ...................... 438/238 |
| 6,211,031 B1 | | 4/2001 | Lin et al. |
| 6,436,750 B1 | * | 8/2002 | Dahl ...................... 438/210 |
| 6,548,851 B2 | | 4/2003 | Bae et al. |
| 6,653,155 B2 | * | 11/2003 | Won et al. ................. 438/3 |
| 6,730,573 B1 | | 5/2004 | Ng et al. |
| 7,059,041 B2 | * | 6/2006 | Behammer ................ 29/832 |
| 2003/0183880 A1 | * | 10/2003 | Goto et al. ............... 257/379 |

* cited by examiner

*Primary Examiner*—Lex Malsawma
(74) *Attorney, Agent, or Firm*—Myers Bigel Sibley & Sajovec PA (57) ABSTRACT

Methods of forming integrated circuit devices include forming patterned layers having different resistivities on semiconductor substrates. These methods include forming a first electrically conductive layer having a first resistivity on first and second portions of a semiconductor substrate. The first portion of the semiconductor substrate may include a memory cell array portion of the substrate and the second portion of the semiconductor substrate may include a peripheral circuit portion of the substrate, which extends adjacent the memory cell array portion. The first electrically conductive layer is patterned to define an upper capacitor electrode on the first portion of the substrate and a resistive pattern on the second portion of the substrate. A second electrically conductive layer is then formed on a third portion of the substrate and on the resistive pattern. The second electrically conductive layer is patterned to define a first resistor pattern on the third portion of the substrate and a patterned resistor cap on the resistive pattern.

23 Claims, 7 Drawing Sheets

METHODS OF FABRICATING INTEGRATED CIRCUIT DEVICES HAVING RESISTORS WITH DIFFERENT RESISTIVITIES THEREIN

REFERENCE TO PRIORITY APPLICATION

This application claims priority to Korean Application Serial No. 2004-84395, filed Oct. 21, 2004, the disclosure of which is hereby incorporated herein by reference.

FIELD OF THE INVENTION

The present invention relates to methods of fabricating integrated circuit devices and, more particularly, to methods of fabricating integrated circuit devices containing resistors and devices formed thereby.

BACKGROUND OF THE INVENTION

Integrated circuit devices frequently utilize active and passive devices to achieve desired operating characteristics. Typical passive devices include capacitors, resistors and inductors. Many techniques have been developed to form resistors having different resistance values and some of these techniques include using different materials having different resistivities and different dimensions. One such technique, which is disclosed in U.S. Pat. No. 6,548,851, includes forming a resistor in a peripheral circuit area of a semiconductor substrate. This resistor is formed from the same material used to define an upper capacitor electrode in a memory cell array area of the substrate. U.S. Pat. No. 6,730,573 discloses forming a resistor from a metal layer that is also used to define an upper capacitor electrode. U.S. Pat. No. 6,040,596 discloses a resistor formed from the same material as an upper plate electrode of a memory cell capacitor. Conventional techniques for forming resistors are also disclosed in U.S. Pat. Nos. 4,643,777 and 6,211,031.

Notwithstanding these conventional techniques for forming resistors, there continues to be a need for improved methods of forming resistors on integrated circuit substrates.

SUMMARY OF THE INVENTION

Methods of forming integrated circuit devices according to embodiments of the invention include forming patterned layers having different resistivities on semiconductor substrates. These embodiments can include forming a first electrically conductive layer having a first resistivity on first and second portions of a semiconductor substrate. The first portion of the semiconductor substrate may include a memory cell array portion of the substrate and the second portion of the semiconductor substrate may include a peripheral circuit region of the substrate, which extends adjacent the memory cell array portion. The first electrically conductive layer is patterned to define an upper capacitor electrode on the first portion of the substrate and a resistive pattern on the second portion of the substrate. After this patterning step, a second electrically conductive layer is formed on a third portion of the substrate and on the resistive pattern. This second electrically conductive layer has a second resistivity, which is greater than the first resistivity. The second electrically conductive layer is patterned to define a first resistor pattern on the third portion of the substrate and a patterned resistor cap on the resistive pattern. This patterned resistor cap may directly contact an upper surface of the first resistive pattern. The patterned resistor cap and the resistive pattern may collectively define a first resistor. In these embodiments, after the second electrically conductive layer is patterned, the resistive pattern is patterned to form a lower resistive resistor pattern. In these embodiments, a resistance of the resistive pattern may be less than a resistance of the first resistor pattern. The first resistivity may be less than about 100 μΩcm and the second resistivity may be greater than about 100 μΩcm.

According to preferred aspects of these embodiments, the first electrically conductive layer may be a material selected from a group consisting of metals and metal oxides and combinations thereof. Exemplary metals and metal oxides include Ru, Pt, Ir, Cu, W, TiN, TaN, WN, $IrO_2$ and $RuO_2$ and combinations thereof. The first electrically conductive layer may also have a thickness in a range from about 100 Å to about 1000 Å. Moreover, the second electrically conductive layer may be doped or undoped polysilicon and have a thickness in a range from about 250 Å to about 3000 Å.

The step of forming a first electrically conductive layer may be preceded by the steps of forming a lower capacitor electrode on the first portion of the substrate, and forming a capacitor dielectric layer on the lower capacitor electrode. This capacitor dielectric layer may also be formed on the second portion of the substrate. Moreover, the step of patterning the first electrically conductive layer may include patterning the first electrically conductive layer and the capacitor dielectric layer in sequence to define an upper capacitor electrode on the lower capacitor electrode and a resistive pattern on a patterned portion of the capacitor dielectric layer. Alternatively, the step of patterning the first electrically conductive layer can include selectively patterning the first electrically conductive layer using the capacitor dielectric layer as an etch-stop layer.

Methods of forming integrated circuit devices according to further embodiments of the invention include the steps of forming a first electrically conductive layer having a first resistivity on first and second portions of a semiconductor substrate and patterning the first electrically conductive layer to define an upper capacitor electrode on the first portion of the substrate and a resistive pattern on the second portion of the substrate. A second electrically conductive layer is then formed on the upper capacitor electrode, a third portion of the substrate and on the resistive pattern. The second electrically conductive layer has a second resistivity, which is greater than the first resistivity. The second electrically conductive layer is patterned to define a patterned capacitor cap on the upper capacitor electrode, a first resistor pattern on the third portion of the substrate and a patterned resistor cap on the resistive pattern. In these embodiments, when the second electrically conductive layer is patterned, the resistive pattern is patterned to form a lower resistive resistor pattern.

Still further embodiments of the invention include forming an integrated circuit device by forming a first electrically conductive layer having a first resistivity on first and second portions of a semiconductor substrate and patterning the first electrically conductive layer to define a lower capacitor electrode on the first portion of the substrate and a first resistor pattern on the second portion of the substrate. A capacitor dielectric layer is then formed on the lower capacitor electrode and on the first resistor pattern. A second electrically conductive layer having a second resistivity, which is less than the first resistivity, is then formed on the lower capacitor electrode and on a third portion of the substrate. This second electrically conductive layer is patterned to define an upper electrode on the lower capacitor electrode and a second resistor pattern on the third portion of the substrate.

Additional embodiments of the invention include integrated circuit devices. These devices include a first resistor on a first portion of a semiconductor substrate and a second resistor on a second portion of the semiconductor substrate. The second resistor includes an underlying pattern of a second electrically conductive material that is different from and has a lower resistivity than the first electrically conductive material and a capping layer pattern. This capping layer pattern extends directly on an upper surface of the underlying pattern. The capping layer pattern may be formed using the same material that defines the first resistor. These embodiments further include a capacitor on a third portion of the semiconductor substrate. The capacitor has an upper electrode made of the second electrically conductive material. The capacitor capping layer extends on the upper electrode and is made of the same material as the first resistor.

DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being on another layer or substrate, it can be directly on the other layer or substrate, or intervening layers may also be present. Like numbers refer to like elements throughout.

Figure 1A:
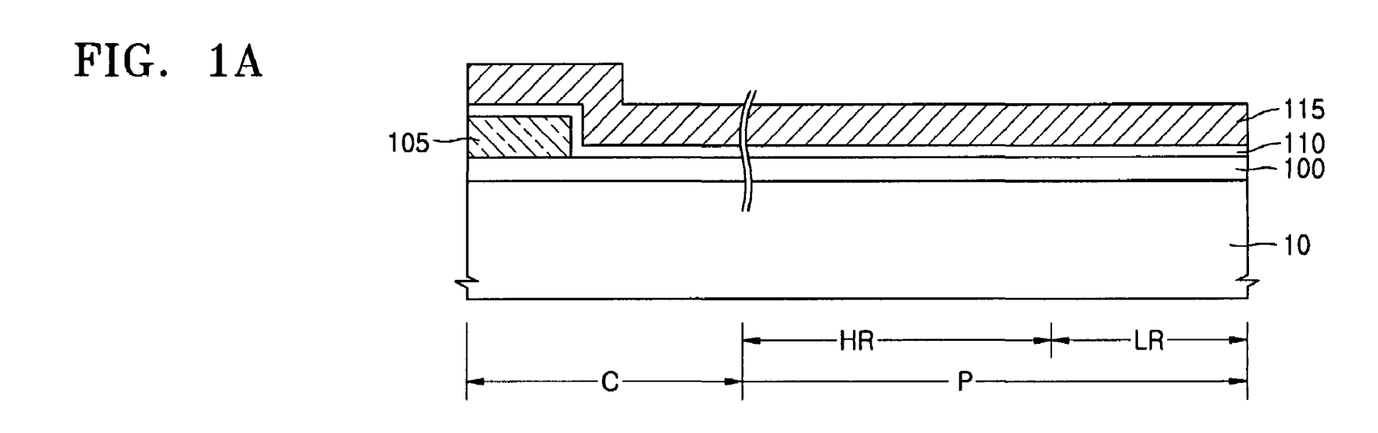
FIGS. 1A-1E are cross-sectional views of intermediate structures that illustrate methods of forming integrated circuit devices according to embodiments of the present invention.

Methods of forming integrated circuit devices according to first embodiments of the invention are illustrated by FIGS. 1A-1E. In particular, FIG. 1A is a cross-sectional view of a semiconductor substrate 10 containing a memory cell array portion (C) and a peripheral circuit portion (P), which contains a high resistivity region (HR) and a low resistivity region (LR). As illustrated, an electrically insulating layer 100 is provided on a primary surface of the substrate 10. Transistors (not shown) may be formed within the substrate 10 prior to formation of the insulating layer 100. The cell array portion (C) of the substrate 10 includes a patterned lower capacitor electrode 105. This lower capacitor electrode 105 may be formed as a patterned metal layer or a patterned polysilicon layer, for example. The lower capacitor electrode 105 and the electrically insulating layer 100 may be covered by a capacitor dielectric layer 110. The capacitor dielectric layer 110 may be made of a high dielectric material such as tantalum oxide (Ta2O5), aluminum oxide (Al2O3) and hafnium oxide (HfO2), for example. After the capacitor dielectric layer 110 has been formed, an electrically conductive layer 115 having a relatively high conductivity is deposited on the capacitor dielectric layer 110. This electrically conductive layer 115 may constitute a metal layer or a metal oxide layer or combinations thereof. Preferred metal layers include Ru, Pt, Ir, Cu, W, TiN, TaN and WN and preferred metal oxide layers include IrO2 and RuO2, for example. The electrically conductive layer 115 may be formed to a thickness in a range from between about 100 Å to about 1000 Å and have a resistivity of less than about 100 µΩcm.

Figure 1B:
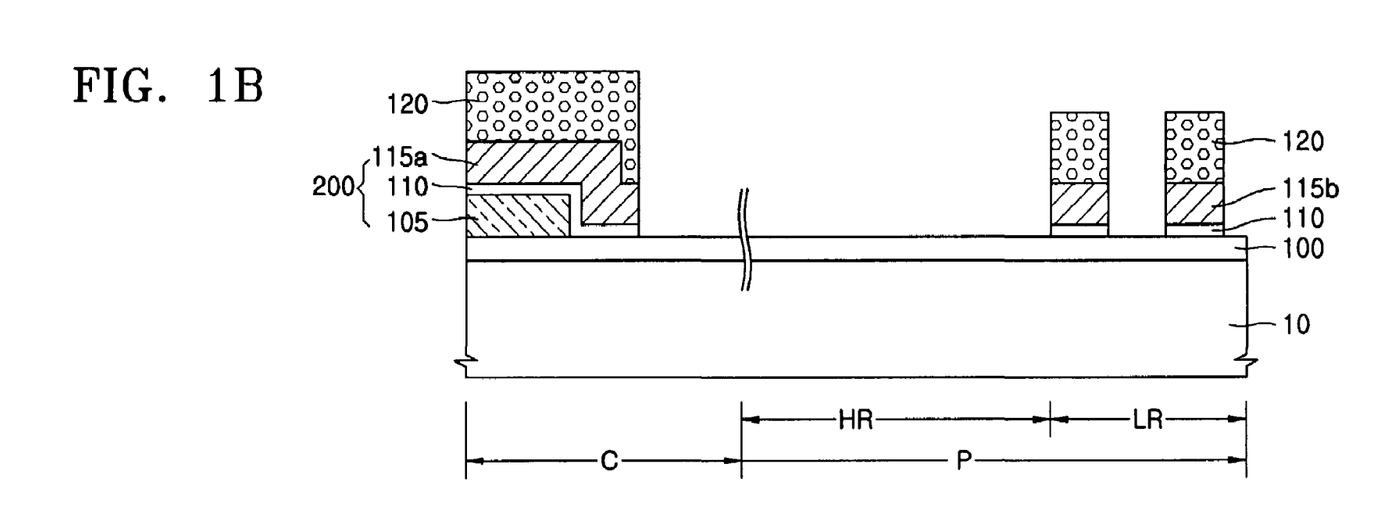

Referring now to FIG. 1B, a layer of photoresist material is deposited on the electrically conductive layer 115 and patterned to define a first photoresist mask 120. A step is then performed to etch the electrically conductive layer 115 using the first photoresist mask 120 as an etching mask. This etching step is performed to define an upper capacitor electrode 115a of a capacitor 200 in the cell array portion (C) of the substrate 10 and also define a dummy conductive layer pattern 115b (as a resistive pattern) on the low resistivity region (LR). Futhermore, by this etching step, the electrically conductive layer 115 may be removed on the high resistivity region(HR). As illustrated, the etching step may also result in a removal of exposed portions of the capacitor dielectric layer 110, however, in alternative embodiments of the invention, the capacitor dielectric layer 110 operates as an etch-stop layer and is not removed by this etching step.

Figure 1C:
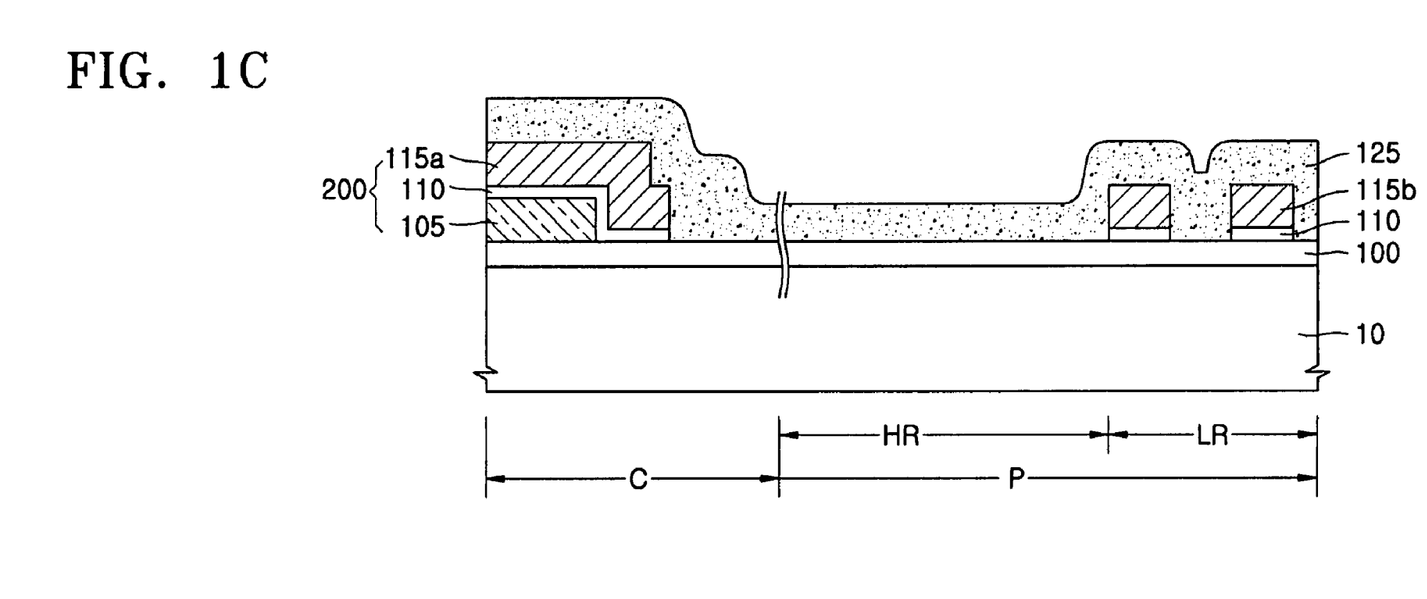

Referring now to FIG. 1C, a capping material layer 125 is deposited on the substrate 10 to cover the upper capacitor electrode 115a and the dummy conductive layer pattern 115b. This capping material layer 125, which may have a thickness in a range from about 250 Å to about 3000 Å, is preferably a relatively high resistivity material such as polysilicon. If the capping material layer 125 is polysilicon, then the conductivity of the capping material layer 125 may be adjusted using an in-situ doping technique or ion implantation, for example. In particular, the capping material layer 125 may be formed to have a resistivity of greater than about 100 µΩcm.

Figure 1D:
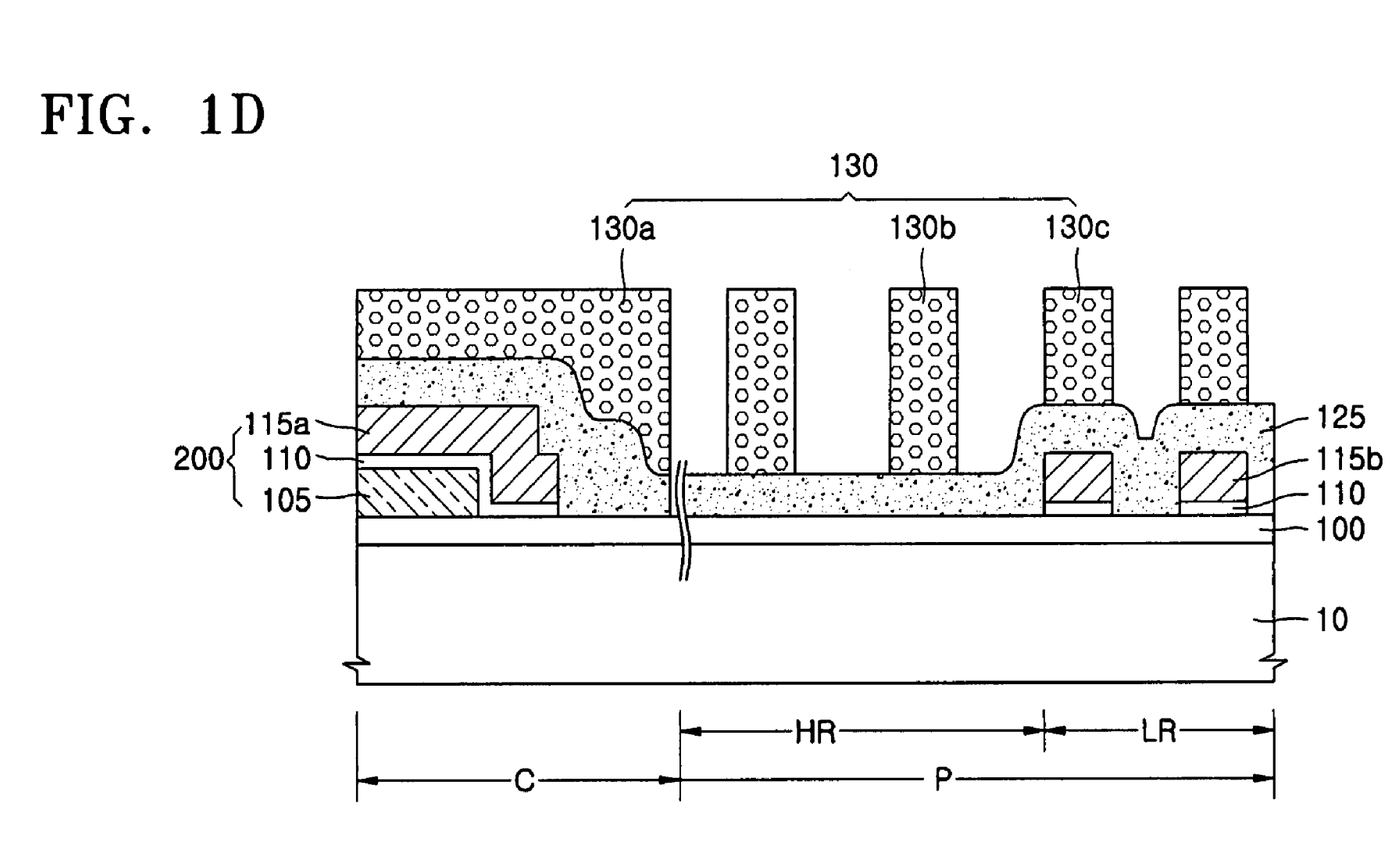
Figure 1E:
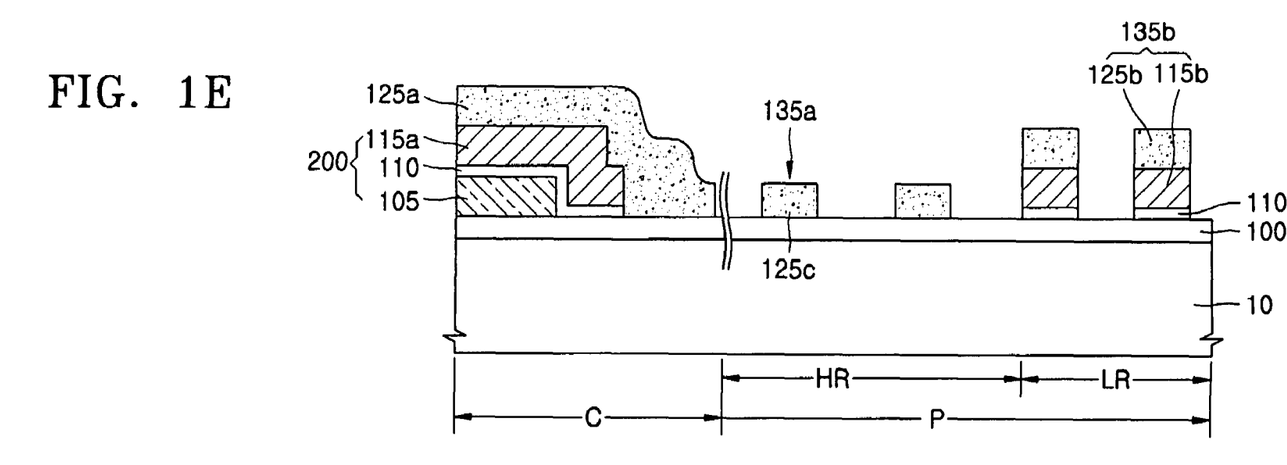

As illustrated by FIGS. 1D-1E, another layer of photoresist material is then deposited on the capping material layer 125 and patterned to define a second photoresist mask 130. This second photoresist mask 130 includes a capping layer defining pattern 130a, a high resistivity resistor defining pattern 130b and a low resistivity defining pattern 130c. Then, the capping material layer 125 is etched using the second photoresist mask 130 as an etching mask and the electrically insulating layer 100 as an etch stop layer. The second photoresist mask 130 is then removed to reveal a capping layer 125a, which covers the capacitor 200 in the cell array portion (C), a first resistivity pattern 125c, which forms a resistor 135a in the high resistivity region (HR), and a patterned resistor cap 125b, which forms a resistor 135b in the low resistivity region (LR). The patterned resistor cap 125b directly contacts an upper surface of the dummy conductive layer pattern 115b (i.e., the resistive pattern) to thereby define a relatively low resistivity resistor 135b. Electrodes and conductive vias (not shown), which are electrically connected to the resistors 135a and 135b, may be formed in interlayer insulating layers (not shown), which are deposited on the resistors 135a and 135b.

Figure 2A:
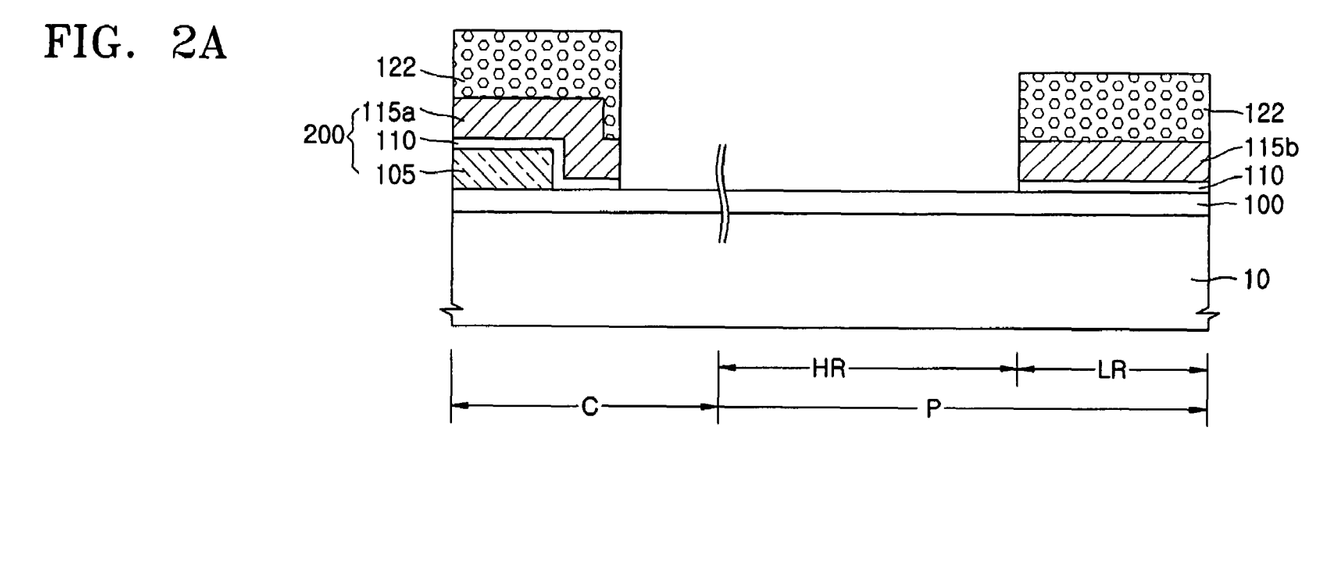
FIGS. 2A-2C are cross-sectional views of intermediate structures that illustrate methods of forming integrated circuit devices according to embodiments of the present invention.
Figure 2B:
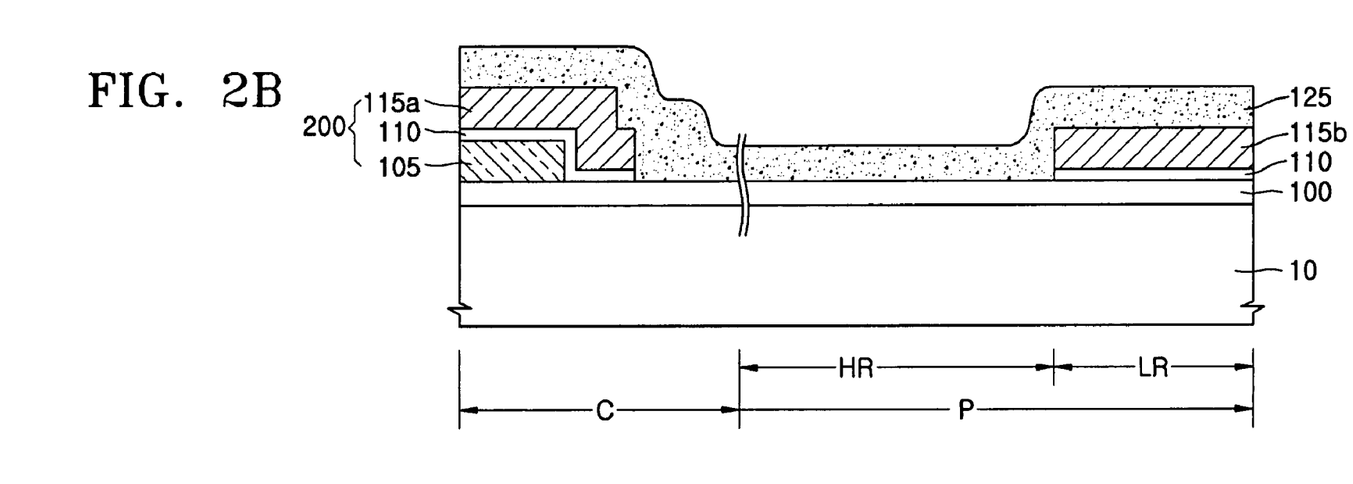
Figure 2C:
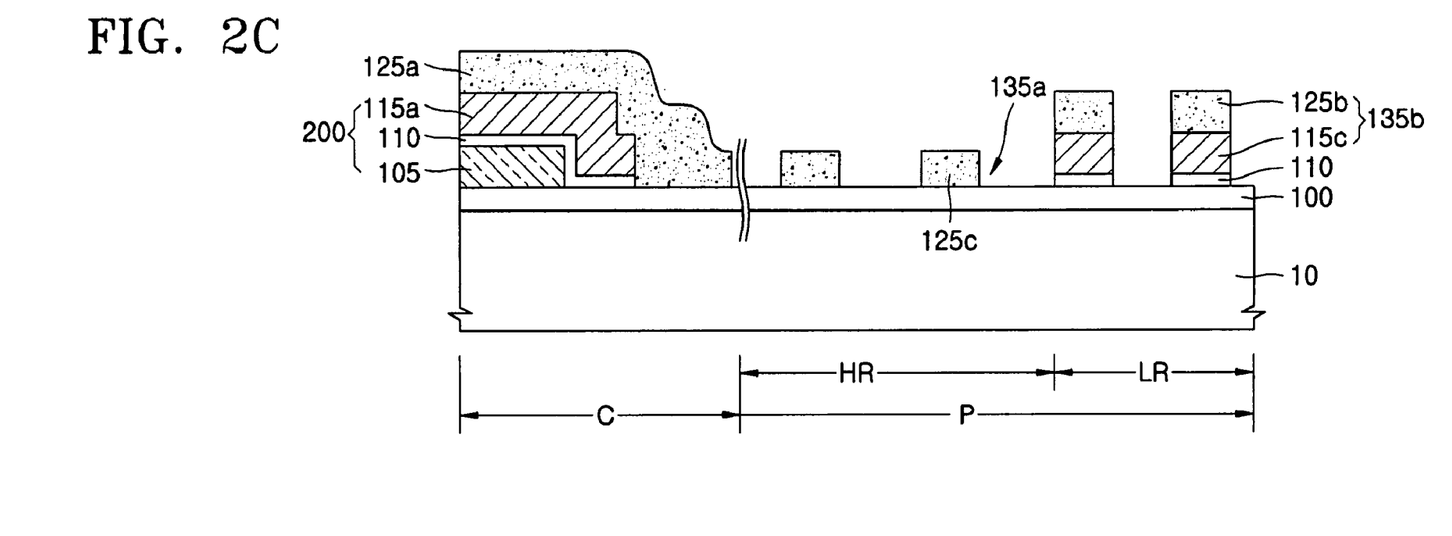

Methods of forming integrated circuit devices according to second embodiments of the invention are illustrated by FIGS. 2A-2C. In particular, FIG. 2A is a cross-sectional view of a semiconductor substrate 10 containing a memory cell array portion (C) and a peripheral circuit portion (P), which contains a high resistivity region (HR) and a low resistivity region (LR). As illustrated, an electrically insulating layer 100 is provided on a primary surface of the substrate 10. Transistors (not shown) may be formed within the substrate 10 prior to formation of the insulating layer 100. The cell array portion (C) of the substrate 10 includes a patterned lower capacitor electrode 105. This lower capacitor electrode 105 may be formed as a patterned metal layer or a patterned polysilicon layer, for example. The lower capacitor electrode 105 and the electrically insulating layer 100 may be covered by a capacitor dielectric layer 110. The capacitor dielectric layer 110 may be made of a high dielectric material such as tantalum oxide (Ta2O5), aluminum oxide (Al2O3) and hafnium oxide (HfO2). After the capacitor dielectric layer 110 has been formed, an electrically conductive layer 115 having a relatively high conductivity is deposited on the capacitor dielectric layer 110. This electrically conductive layer 115 may constitute a metal layer or a metal oxide layer or combinations thereof. Preferred metal layers include Ru, Pt, Ir, Cu, W, TiN, TaN and WN and preferred metal oxide layers include IrO2 and RuO2, for example. The electrically conductive layer 115 may be formed to a thickness in a range from between about 100 Å to about 1000 Å and have a resistivity of less than about 100 μΩcm. A layer of photoresist material is then deposited on the electrically conductive layer 115 and patterned to define a photoresist mask 122. A step is then performed to etch the electrically conductive layer 115 using the photoresist mask 122 as an etching mask. This etching step is performed to define an upper capacitor electrode 115a of a capacitor 200 in the cell array portion (C) of the substrate 10 and define a resistive pattern 115b on the low resistivity region (LR). Futhermore, by this etching step, the electrically conductive layer 115 may be removed on the high resistivity region(HR).

As illustrated, this etching step may also result in a removal of exposed portions of the capacitor dielectric layer 110.

Referring now to FIG. 2B, a capping material layer 125 is deposited on the substrate 10 to cover the upper capacitor electrode 115a and the resistive pattern 115b. This capping material layer 125, which may have a thickness in a range from about 250 Å to about 3000 Å, is preferably a relatively high resistivity material such as polysilicon. If the capping material layer 125 is polysilicon, then the conductivity of the capping material layer 125 may be adjusted using an in-situ doping technique or ion implantation, for example. In particular, the capping material layer 125 may be formed to have a resistivity of greater than about 100 μΩcm. As illustrated by FIG. 2C, the capping material layer 125 is then selectively patterned to define a capping layer 125a, which covers the capacitor 200 in the cell array portion (C), a first resistivity pattern 125c, which forms a resistor 135a in the high resistivity region (HR), and a patterned resistor cap pattern 125b, which forms a resistor 135b in the low resistivity region (LR). Furthermore, after the capping material layer 125 is patterned, the resistive pattern 115b on the low resistivity region (LR) is sequentially patterned to define a lower resistive resistor pattern 115c. The patterned resistor cap 125b directly contacts an upper surface of the lower resistive resistor pattern 115c to thereby define a relatively low resistivity resistor 135b.

Figure 3A:
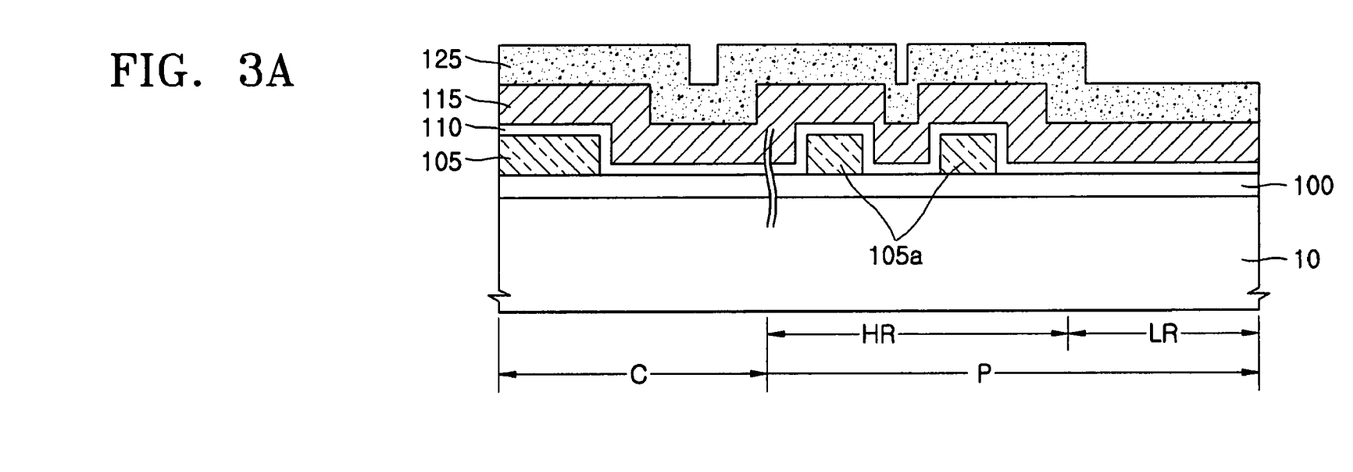
FIGS. 3A-3C are cross-sectional views of intermediate structures that illustrate methods of forming integrated circuit devices according to embodiments of the present invention.
Figure 3B:
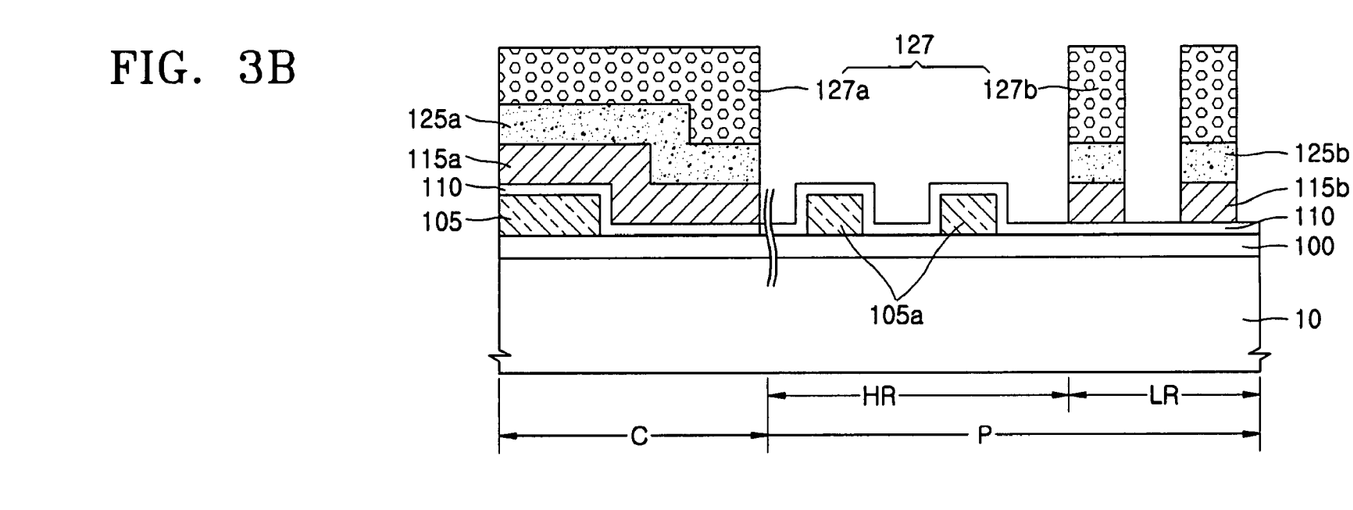
Figure 3C:
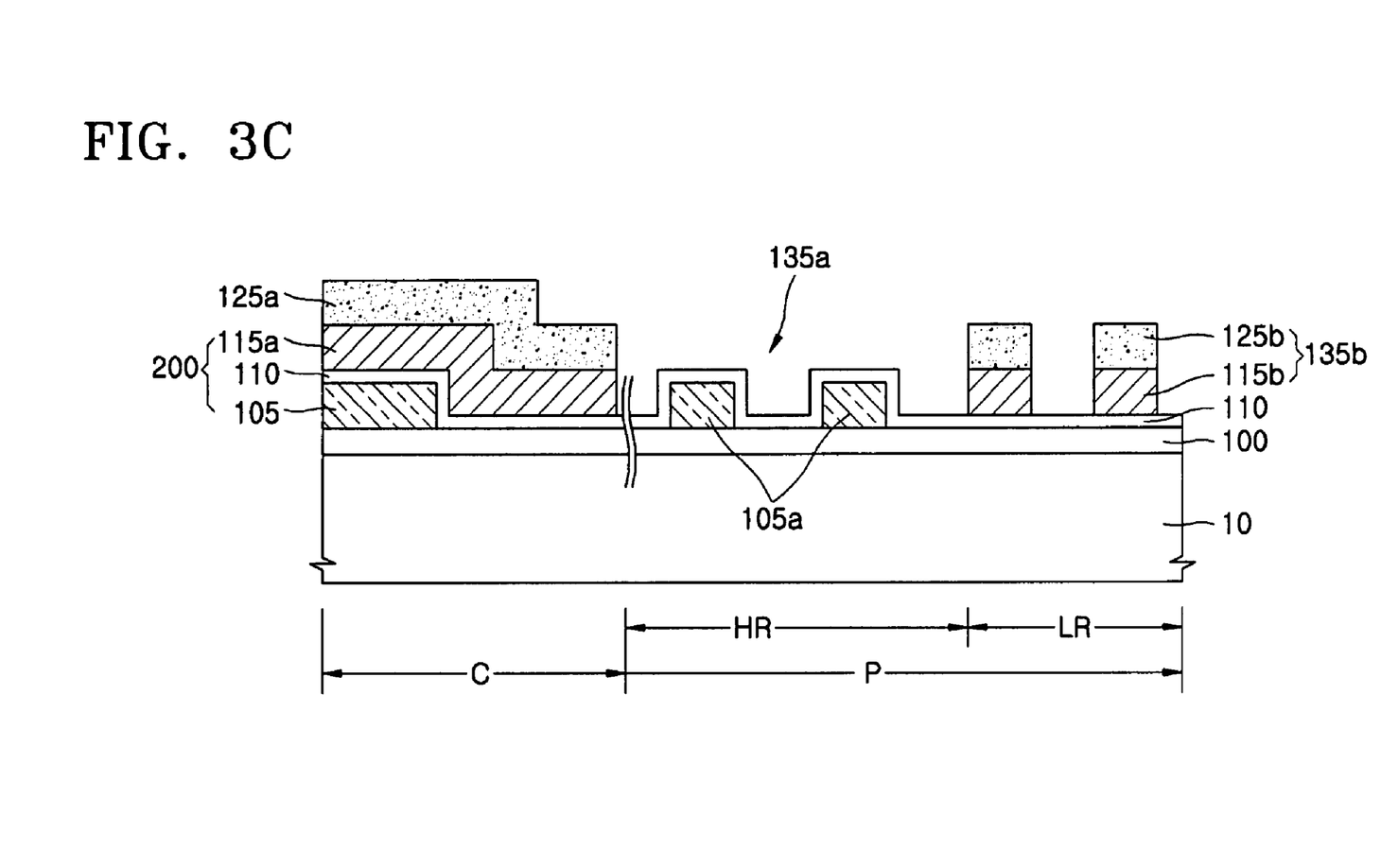

Methods of forming integrated circuit devices according to third embodiments of the invention are illustrated by FIGS. 3A-3C. In particular, FIG. 3A is a cross-sectional view of a semiconductor substrate 10 containing a memory cell array portion (C) and a peripheral circuit portion (P), which contains a high resistivity region (HR) and a low resistivity region (LR). As illustrated, an electrically insulating layer 100 is provided on a primary surface of the substrate 10. Transistors (not shown) may be formed within the substrate 10 prior to formation of the insulating layer 100. The cell array portion (C) of the substrate 10 includes a patterned lower capacitor electrode 105 formed of polysilicon and a dummy polysilicon layer pattern 105a on the high resistivity region (HR). The conductivity of the patterned lower capacitor electrode 105 and the dummy polysilicon layer pattern 105a may be adjusted using in-situ doping and ion implantation techniques. The patterned lower capacitor electrode 105 and the dummy polysilicon layer pattern 105a may be formed to a thickness in a range from about 200 Å to about 1500 Å and have a resistivity of greater than about 100 μΩcm.

The patterned lower capacitor electrode 105 and the dummy polysilicon layer pattern 105a are then covered by a capacitor dielectric layer 110. The capacitor dielectric layer 110 may be made of a high dielectric material such as tantalum oxide (Ta2O5), aluminum oxide (Al2O3) and hafnium oxide (HfO2). After the capacitor dielectric layer 110 has been formed, an electrically conductive layer 115 having a relatively high conductivity is deposited on the capacitor dielectric layer 110. This electrically conductive layer 115 may constitute a metal layer or a metal oxide layer or combinations thereof. Preferred metal layers include Ru, Pt, Ir, Cu, W, TiN, TaN and WN and preferred metal oxide layers include IrO2 and RuO2, for example. The electrically conductive layer 115 may be formed to a thickness in a range from between about 100 Å to about 1000 Å and have a resistivity of less than about 100 μΩcm. A capping material layer 125 may also be deposited on the electrically conductive layer 115. This capping material layer 125, which may have a thickness in a range from about 250 Å to about 3000 Å, is preferably a relatively high resistivity material such as polysilicon. If the capping material layer 125 is polysilicon, then the conductivity of the capping material layer 125 may be adjusted using an in-situ doping technique or ion implantation, for example. In particular, the capping material layer 125 may be formed to have a resistivity of greater than about 100 μΩcm Referring now to FIGS. 3B-3C, a photoresist mask 127 is then deposited on the capping material layer 125 and patterned into an upper electrode defining pattern 127a and a low resistivity resistor defining pattern 127b. The capping material layer 125 and the electrically conductive layer 115 are then selectively etched using the photoresist mask 127 as an etching mask. This etching step is performed to define a capping layer 125a and an upper capacitor electrode 115a in the cell array portion (C) of the substrate 10 and define a low resistivity resistor 135b in the low resistivity portion (LR) of the substrate 10. This low resistivity resistor 135b includes a patterned resistor cap pattern 125b directly on an upper surface of the dummy conductive layer pattern 115b. The photoresist mask 127 is then removed. In addition, based on a prior patterning step, the dummy polysilicon layer pattern 105a may represent a high resistivity resistor 135a in the high resistivity region (HR).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising the steps of:
    forming a first electrically conductive layer having a first resistivity on first and second portions of a semiconductor substrate;
    etching the first electrically conductive layer to define an upper capacitor electrode on the first portion of the substrate and a resistive pattern on the second portion of the substrate;
    forming a second electrically conductive layer having a second resistivity, which is greater than the first resistivity, on a third portion of the substrate and on the resistive pattern; and
    etching the second electrically conductive layer to define a first resistor pattern on the third portion of the substrate and a patterned resistor cap on the resistive pattern.

2. The method of claim 1, further comprising patterning the resistive pattern to define a lower resistor pattern after said step of etching the second electrically conductive layer.

3. The method of new claim 2, wherein the patterned resistor cap and the lower resistor pattern collectively define a second resistor.

4. The method of claim 3, wherein a resistance of the first resistor pattern is greater than a resistance of the second resistor.

5. The method of claim 1, wherein the patterned resistor cap directly contacts an upper surface of the resistive pattern.

6. The method of claim 1, wherein the first resistivity is less than about 100 $\mu\Omega$cm; and wherein the second resistivity is greater than about 100 $\mu\Omega$cm.

7. The method of claim 1, wherein the first electrically conductive layer comprises a material selected from a group consisting of metals and metal oxides and combinations thereof.

8. The method of claim 1, wherein the first electrically conductive layer comprises a material selected from a group consisting of Ru, Pt, Ir, Cu, W, TiN, TaN, WN, $IrO_2$ and $RuO_2$ and combinations thereof.

9. The method of claim 1, wherein the first electrically conductive layer has a thickness in a range from about 100 Å to about 1000 Å.

10. The method of claim 1, wherein the second electrically conductive layer comprises doped or undoped polysilicon.

11. The method of claim 10, wherein the second electrically conductive layer has a thickness in a range from about 250 Å to about 3000 Å.

12. The method of claim 1, wherein said step of forming a first electrically conductive layer is preceded by the steps of:
    forming a lower capacitor electrode on the first portion of the substrate; and
    forming a capacitor dielectric layer on the lower capacitor electrode.

13. The method of claim 12, wherein said step of forming a capacitor dielectric layer on the lower capacitor electrode comprises forming the capacitor dielectric layer on the second portion of the substrate.

14. The method of claim 13, wherein said step of etching the first electrically conductive layer comprises etching the first electrically conductive layer and the capacitor dielectric layer in sequence to define the upper capacitor electrode on the lower capacitor electrode and the resistive pattern on a patterned portion of the capacitor dielectric layer.

15. The method of claim 13, wherein said step of etching the first electrically conductive layer comprises selectively etching the first electrically conductive layer using the capacitor dielectric layer as an etch-stop layer.

16. The method of claim 13, wherein said step of etching the first electrically conductive layer comprises removing the first electrically conductive layer on the third portion of the substrate.

17. A method of forming an integrated circuit device, comprising the steps of:
    forming a first electrically conductive layer having a first resistivity on first and second portions of a semiconductor substrate;
    patterning the first electrically conductive layer to define an upper capacitor electrode on the first portion of the substrate and a resistive pattern on the second portion of the substrate;
    forming a second electrically conductive layer having a second resistivity, which is greater than the first resistivity, on the upper capacitor electrode, a third portion of the substrate and on the resistive pattern; and
    patterning the second electrically conductive layer to define a patterned capacitor cap on the upper capacitor electrode, a first resistor pattern on the third portion of the substrate and a patterned resistor cap on the resistive pattern.

18. The method of claim 16, wherein the first resistivity is less than about 100 $\mu\Omega$cm; and wherein the second resistivity is greater than about 100 $\mu\Omega$cm.

19. The method of claim 16, wherein the first electrically conductive layer comprises a material selected from a group consisting of Ru, Pt, Ir, Cu, W, TiN, TaN, WN, $IrO_2$ and $RuO_2$ and combinations thereof.

20. The method of claim 16, wherein said step of forming a first electrically conductive layer is preceded by the steps of:
    forming a lower capacitor electrode on the first portion of the substrate; and
    forming a capacitor dielectric layer on the lower capacitor electrode.

21. The method of claim 17, further comprising patterning the resistive pattern to define a lower resistive resistor pattern after said step of patterning the second electrically conductive layer.

22. The method of claim 17, wherein said step of patterning the first electrically conductive layer comprises removing the first electrically conductive layer on the third portion of the substrate.

23. A method of forming an integrated circuit device, comprising the steps of:
    forming a first electrically conductive layer having a first resistivity on first and second portions of a semiconductor substrate
    patterning the first electrically conductive layer to define a lower capacitor electrode on the first portion of the substrate and a first resistor pattern on the second portion of the substrate;

forming a capacitor dielectric layer on the lower capacitor electrode and on the first resistor pattern;

forming a second electrically conductive layer having a second resistivity, which is less than the first resistivity, on the lower capacitor electrode and on a third portion of the substrate;

forming a capping material layer on the second electrically conductive layer; and patterning the capping material layer and the second electrically conductive layer in seguence to define an upper capacitor electrode on the capacitor dielectric layer, a capacitor cap on the upper capacitor electrode, a second resistor pattern on the third portion of the substrate and a resistor cap on the second resistor pattern.

* * * * *